United States Patent [19]

Ikuzaki

[11] Patent Number: 4,549,284
[45] Date of Patent: Oct. 22, 1985

[54] DYNAMIC MOS RANDOM ACCESS MEMORY

[75] Inventor: Kunihiko Ikuzaki, Hinode, Japan
[73] Assignee: Hitachi, Ltd., Tokyo, Japan
[21] Appl. No.: 473,866
[22] Filed: Mar. 10, 1983
[30] Foreign Application Priority Data Mar. 10, 1982 [JP] Japan .................................. 57-36422

[51] Int. Cl.$^4$ ............................................... G11C 7/00
[52] U.S. Cl. ..................................... 365/222; 365/203
[58] Field of Search ................. 365/222, 203, 195, 193

[56] References Cited

U.S. PATENT DOCUMENTS 4,079,462  3/1978  Koo ...................................... 365/222
4,412,314  10/1983 Proebsting ........................... 365/222

FOREIGN PATENT DOCUMENTS 0019142  11/1980  European Pat. Off. ............ 365/222
2517872   6/1976  Fed. Rep. of Germany .
2543515   4/1977  Fed. Rep. of Germany .
3030347   3/1981  Fed. Rep. of Germany .
3009872   9/1981  Fed. Rep. of Germany .

OTHER PUBLICATIONS

J. G. Posa, "What to Expect Next: a Special Report", Electronics, May 22, 1980, pp. 119-129.
J. G. Posa, "In Memories, C-MOS Speeds up and Redundancy Catches on", Electronics, Feb. 24, 1981, pp. 141-146.
H. Leung et al., "Storage Cell Restore Circuit", IBM Technical Disclosure Bulletin, vol. 12, No. 12, May 1970, p. 2213.
Elektronic 1976, Heft 10, pp. 59-61.
M. Taniguchi et al., "Fully Boosted 64K Dynamic RAM with Automatic and Self-Refresh", IEEE Journal of Solid-State Circuits, vol. SC-16, No. 5, Oct. 1981, pp. 492-498.

*Primary Examiner*—Joseph A. Popek
*Attorney, Agent, or Firm*—Antonelli, Terry & Wands

[57] ABSTRACT

A dynamic random access memory, which is accessed in response to an address strobe signal, has an automatic refresh circuit which consists of a clock generator that generates refresh clock pulses when the address strobe signal is not produced, and an address counter that increments a refresh address by counting the refresh clock pulses. Information retained in memory cells is automatically refreshed by an operation of the automatic refresh circuit. The dynamic random access memory of this arrangement does not need a special external terminal for the refresh operation and an external circuit associated therewith. Thus, the random access memory of this arrangement constructs, in effect, a pseudo static random access memory.

20 Claims, 9 Drawing Figures

DYNAMIC MOS RANDOM ACCESS MEMORY

BACKGROUND OF THE INVENTION

This invention relates to a dynamic RAM (random access memory) which is constructed of a MOS (metaloxide-semiconductor) integrated circuit.

The dynamic RAM (hereinbelow, termed "D.RAM") includes a plurality of memory cells for storing information. The memory cell is constructed of, for example, a capacitor for storing the information in the form of charges, and an insulated-gate field effect transistor (hereinbelow, termed "MOSFET" or "MOS transistor") for selecting an address.

In the D.RAM which is formed on a semiconductor substrate, the charges stored in the capacitor within the memory cell decrease with time on account of leakage current etc. In other words, the information stored in the memory cell is lost with the lapse of time.

In order to normally keep correct information stored in the memory cell, it is necessary to perform the so-called refresh operation in which the information stored in the memory cell is read out before it is lost. This information is then amplified, and the amplified information is written into the same memory cell again.

The refresh operation of memory cells in a D.RAM of 64 kilobits can be carried out by a circuit having a self-refresh function as described in, for example, a Japanese magazine 'Denshi Gijutsu (Electronics Technology)', Vol. 23, No. 3, pp. 30–33. The D.RAM described in this article has an external terminal for the refresh control. When a refresh control signal $\overline{REF}$ of predetermined level is applied to the external terminal, a plurality of memory cells within the D.RAM are automatically refreshed. In this case, however, the external terminal for the refresh control must be disposed in the D.RAM. Thus, the cost of the device rises because of the requirement of having the external terminal for the refresh operation.

The D.RAM of 64 kilobits referred to above is adapted to operate with a single power source. Moreover, it reduces the number of external terminals to 16 by adopting an address multiplex system. That is, it is encased in a package of 16 pins.

The memory capacities of D.RAMs have become large with the progress of semiconductor integrated circuit technology etc. It has accordingly become possible to manufacture a D.RAM having a large capacity of, e.g., 256 kilobits.

The number of bits of address signals required for a D.RAM having such large capacity as 256 kilobits increases in comparison with that for a D.RAM of 64 kilobits. Therefore, even when the multiplex system is adopted for a D.RAM of 256 kilobits, it is difficult to install this D.RAM on the same package of 16 pins as that of the D.RAM of 64 kilobits. More specifically, a D.RAM of 256 kilobits employing the address multiplex system requires 9 pins for address signal terminals, 2 pins for address strobe signal terminals ($\overline{RAS}$, $\overline{CAS}$), 1 pin for a read/write signal terminal ($\overline{WE}$), 1 pin for an output signal terminal ($D_{OUT}$), 1 pin for an input signal terminal ($D_{in}$) and 2 pins for power source terminals. These pins alone total 16. Therefore, if an additional pin is used for the refresh operation, a D.RAM of 256 kilobits becomes imcompatible with a D.RAM of 64 kilobits. This makes it difficult for potential users of such a 256 kilobit D-RAM to utilize the device.

In order to permit the self-refresh operation described above, the D.RAM needs to be supplied with the refresh control signal $\overline{REF}$. Therefore, a special external circuit for forming the refresh control signal $\overline{REF}$ must be disposed outside the D.RAM. The increased circuitry brought about by an external circuit is undesirable. Moreover, the signal $\overline{REF}$ to be supplied to the external terminal of the D.RAM is delayed comparatively greatly in this case, which leads to the disadvantage that the access cycle of the memory becomes longer than is necessary. More specifically, wiring in a printed circuit board or the like, on which the D.RAM is installed, has a comparatively large wiring capacitance etc. and thus forms a heavy load. The signal delay accordingly develops in the wiring. This results in the restriction that the signal $\overline{REF}$ to be supplied to the D.RAM cannot be supplied at a high rate of speed due to inherent wiring delays.

SUMMARY OF THE INVENTION

It is accordingly an object of this invention to provide a D.RAM in which the refresh of a plurality of memory cells is automatically effected without increasing the number of external terminals.

Another object of this invention is to provide a D.RAM capable of reducing external circuits.

Another object of this invention is to provide a D.RAM capable of performing a high speed operation.

Further objects of this invention will become apparent from the following description taken with reference to the drawings.

Figure 8:
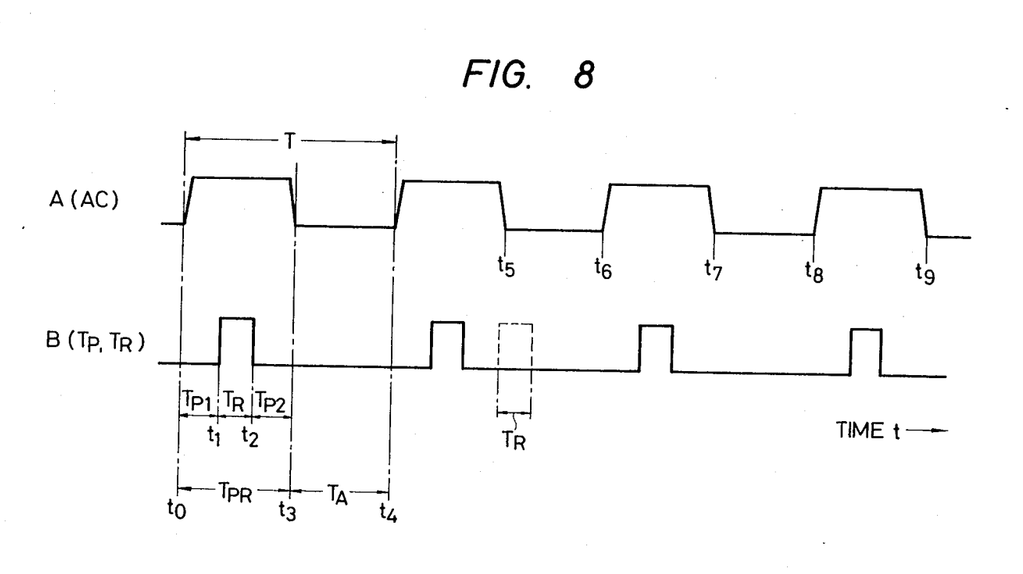
FIG. 8 is a timing chart of a D.RAM operation for explaining this invention.

A D.RAM is used as the memory of, for example, a computer. A central processing unit (hereinbelow, termed "CPU"), which is central to data processing in the computer, has its operation controlled on the basis of system clocks. Accordingly, access to the D.RAM by the CPU is permitted at a periodical timing which is determined by the operating characteristics of the CPU, the system clock signals etc. As a result, the timing at which the CPU can access the D.RAM is periodically set. This can be done in such a manner that the access to the D.RAM by the CPU is controlled by a timing signal having a certain period (a timing signal having the same period as a memory access period). Part A in FIG. 8 shows a timing chart of a timing signal AC which stipulates the memory access period of the CPU for the D.RAM. The start of the access to the D.RAM by the CPU is not carried out when the timing signal AC is at a high level, and it is allowed only when the timing signal AC falls. Information is written into or read out from the accessed memory address of the D.RAM when the timing signal AC is at a low level.

The CPU accesses the D.RAM once in one or more cycles of the timing signal AC in accordance with a program or the like. In a case where the CPU accesses the D.RAM in two cycles of the timing signal AC, by way of example the D.RAM is not accessed in the fall of the signal AC in the first cycle but is accessed in the fall of the signal AC in the next cycle.

Various internal circuits in the D.RAM, such as a decoder, sense amplifier, input buffer, output buffer and timing generator circuit, are constructed of dynamic circuits to the end of low power dissipation. Various circuit nodes in the dynamic circuits are put into precharged states in advance, and are changed to respectively proper levels in the subsequent active periods of time.

The precharging time intervals of the various internal circuits in the D.RAM are set to occur within a time interval during which the D.RAM is not accessed by the CPU. The precharging makes it possible to shorten the access time of the D.RAM. The time interval of writing or reading information in the D.RAM is determined by a time interval during which the D.RAM is accessed by the CPU. The access period of the D.RAM consisting of the two time intervals is changed in proportion to that number of cycles of the timing signal AC which is determined by the program or the like. Accordingly, the time interval for the precharging in the access period is changed in a predetermined relationship proportional to that number of cycles of the timing signal AC which is determined by the program or the like.

The period of the timing signal AC, namely, the basic period of the memory access becomes longer in a computer of low operating speed, for example, a microcomputer, than in a large-sized computer of high operating speed because the operating speed of a CPU in the former is low and also the frequencies of system clocks are low. Accordingly, the timer interval during which the D.RAM is not accessed by the CPU, in other words, the time interval which the CPU gives the D.RAM in order to precharge the internal circuits thereof, becomes longer.

The time interval $T_P$ actually required for precharging the internal circuits of the D.RAM has shortened with the advancement of semiconductor integrated circuit technology etc. The precharging time interval $T_{PR}$ given to the D.RAM by the CPU has therefore become longer than the time interval $T_P$ which is actually required by the internal circuits of the D.RAM. That is, the time of the difference between both the time intervals has become long. The difference time has no significance for the D.RAM and is, so to speak, a dead time.

According to this invention, the memory cells of the D.RAM are refreshed in the dead time.

According to this invention, as will be described in detail later in connection with embodiments, an automatic refresh circuit which performs, at least, the following three operations is disposed within the D.RAM. Specifically, as shown in FIG. 8, the automatic refresh circuit performs the operations of first precharging the internal circuits of the D.RAM (time interval $T_P$), subsequently refreshing desired memory cells (time interval $T_R$), and thereafter executing the precharging again (time interval $T_{P2}$). These operations of the automatic refresh circuit are performed within the time interval $T_{PR}$ which is afforded to the D.RAM by the CPU in order to precharge the internal circuits.

Owing to the provision of the automatic refresh circuit, the refresh of the desired memory cells in the D.RAM is carried out within the dead time. Therefore, the CPU can access the D.RAM as if it were effectively a static RAM (hereinbelow, termed "S.RAM"). In addition, this D.RAM dispenses with the control signal $\overline{REF}$ for the external refresh control which is required in the aforementioned D.RAM having the self-refresh function. Therefore, it becomes unnecessary to provide any special external circuit outside the D.RAM. As a result of this, in the D.RAM of the present invention capacitances such as parasitic capacitances which are coupled to wiring leads formed in the internal circuit thereof become comparatively small because the wiring leads are fabricated by IC technology. It is therefore possible to render the transmission speeds if signals comparatively high. More specifically, in the prior art case where the control signal $\overline{REF}$ is supplied from the external circuit to the D.RAM as stated previously, the operating speed of the D.RAM is limited by the slow transmission speed of the control signal $\overline{REF}$. In contrast, according to the present invention, this external control signal $\overline{REF}$ is dispensed with, and hence, the operating speed of the D.RAM is increased.

In order to more reliably retain the information of the respective memory cells, the D.RAM may be so constructed as to perform an additional refresh operation also in a time interval that is determined by the combination of the state in which the D.RAM is not accessed by the CPU and the state in which the timing signal AC is held at the low level. In order to permit the additional refresh operation, a detector circuit for detecting if the access by the CPU has occurred is disposed within the D.RAM.

The output signal of such a detector circuit is supplied to the aforementioned automatic refresh circuit as, e.g., an operation control signal. In accordance with this arrangement, when it has been detected by the detector circuit that the D.RAM is not accessed, the automatic refresh circuit is continuously operated.

Part B in FIG. 8 shows an example of the timing chart of the refresh operation. The minimum value of the precharging time $T_{PR}$ allotted to the D.RAM by the CPU is stipulated by the timing signal AC. Supposing that the D.RAM has been accessed till a time $t_0$, the precharging of the internal circuits thereof is started in response to the fact that the timing signal AC is brought to the high level at the time $t_0$. The refresh operation is started at a time $t_1$ at which a predetermined precharging period $T_{p1}$ has lapsed. The refresh operation is ended at a time $t_2$ at which a predetermined refresh period $T_R$ has lapsed. The precharging of the internal circuits is started at the time $t_2$ again. The precharging operation started at the time $t_2$ should desirably end before a time $t_3$ at which a re-access to the D.RAM is permitted. Accordingly, the time interval $T_{p2}$ from the time $t_2$ to the time $t_3$ is made longer than the precharging time interval which is required by the internal circuits of the D.RAM.

In a case where the D.RAM has not been accessed at an accessible time $t_5$, that is, in a case where the D.RAM has not been accessed in spite of the change of the timing signal AC to the low level, the refresh operation is performed again as indicated by a broken line in the part B of FIG. 8. In this case, the precharging of the internal circuits has already ended when the timing signal AC falls from the high level to the low level. Accordingly, the automatic refresh circuit is so constructed as to immediately peform the refresh operation of the desired memory cells. In addition, the refresh operation and the precharging operation may be carried out a plurality of times within the time interval $T_R$. In this case, a plurality of memory cells can be refreshed within the time interval $T_R$.

DESCRIPTION OF THE PREFERRED EMBODIMENTS

Now, this invention will be described more in detail in conjunction with embodiments thereof.

Figure 1:
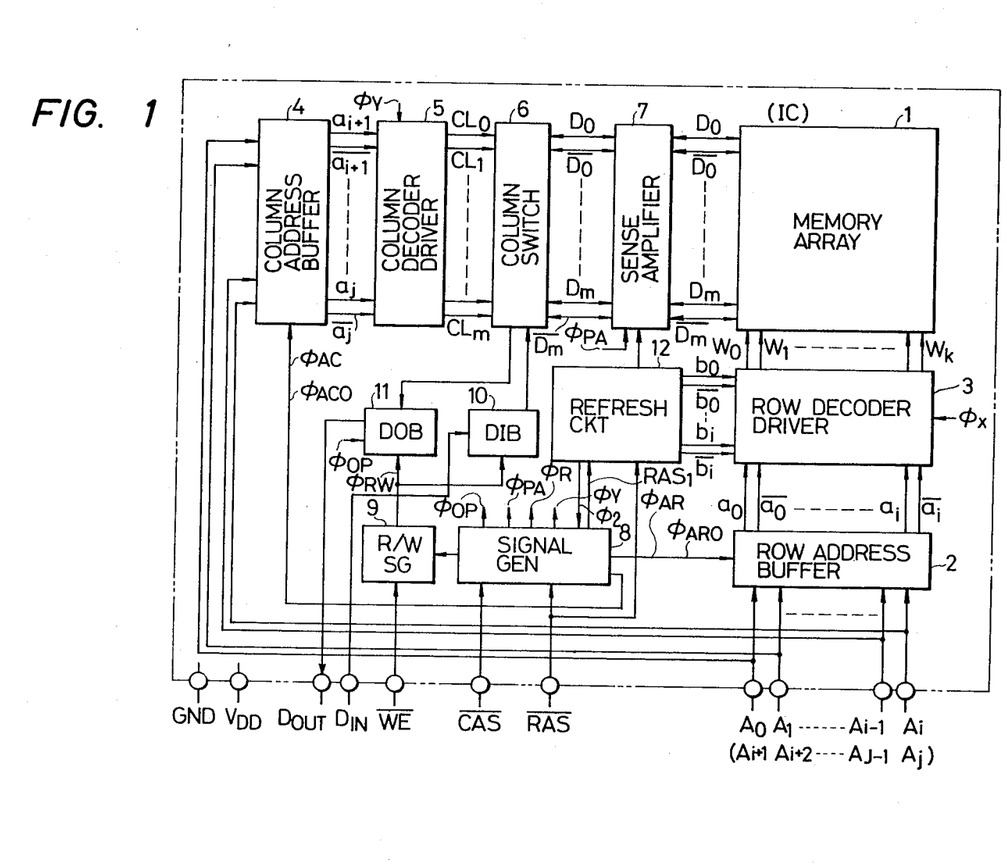
FIG. 1 is a block diagram of a D.RAM showing an embodiment of this invention.

FIG. 1 is a block diagram which shows an embodiment of a D.RAM according to this invention. Respective blocks enclosed with a two-dot chain line in the figure are formed on a single semiconductor substrate by known semiconductor production techniques.

The D.RAM has a ground terminal which is supplied with the ground potential GND of the circuitry, a power source terminal which is supplied with a supply voltage $V_{DD}$ such as +5 volts, an output terminal which delivers a read data signal $D_{OUT}$, an input terminal which is supplied with a write data signal, a write control terminal which is supplied with a write enable signal, $\overline{WE}$, a control terminal which is supplied with a column address strobe signal, a control terminal which is supplied with a row address strobe signal, and address input terminals which are supplied with address signals $A_O$ to $A_i$ or $A_{i+1}$ to $A_j$ in multiplexed fashion.

Although the D-RAM of this embodiment has an automatic refresh circuit 12 to be described later, it does not have an external control terminal to be exclusively used for controlling the circuit 12.

The supply voltage delivered from a power source unit, not shown, is fed across the power source terminal and ground terminal of the D-RAM. Thus, various internal circuits constituting the D-RAM are brought into their respective operating statuses. The output terminal, input terminal, control terminals and address terminals of the D-RAM are coupled to a CPU, not shown, through a proper controller, not shown, built in accordance with known principles.

The arrangement of a memory array itself is conventional, and has a plurality of memory cells disposed in a matrix. Each of the memory cells is formed into a one-MOS transistor/cell structure. That is, each of the memory cells is composed of a switching MOS transistor and a capacitor for retaining information. The gate of the switching MOS transistor is regarded as the select terminal of the memory cell, and the drain of the former as the data input/output terminal of the latter. The select terminals of the memory cells in the matrix array are connected to word lines $W_O$–$W_k$, while the data input/output terminals are connected to data lines $D_O$, $\overline{D_O}$–$D_m$, $\overline{D_m}$. The memory array also includes dummy cells which determine a reference potential in reading out data from the memory cells.

The word lines $W_O$–$W_k$ are respectively assigned row addresses. These word lines are connected to the output terminals of a row decoder and driver 3.

The data lines $D_O$, $\overline{D_O}$–$D_m$, $\overline{D_m}$ are connected to a column switch 6 through a sense amplifier 7. One set of adjoining data lines, for example, $D_O$ and $\overline{D_O}$ are paired. The respective pairs of data lines are assigned column addresses. The paired data lines are selected by the column switch 6.

The illustrated internal circuits, such as a row address buffer 2, the row decoder and driver 3, a column address buffer 4, a column decoder and driver 5, the sense amplifier 7, a data input buffer 10 and a data output buffer 11, are constructed of dynamic circuits in order to reduce the power dissipation of the circuits. That is, these internal circuits have circuit elements such as precharging MOS transistors, not shown, which are dynamically driven. As is well known in the art, precharge pulses for bringing these internal circuits into precharged statuses, and control pulses for bringing them into operating statuses are delivered from a signal generator 8.

The signal generator 8 delivers the precharge pulse to be supplied to the internal circuits, in response to the change of the row address strobe signal $\overline{RAS}$ from its low level to its high level, this signal being supplied to the external terminal of the memory chip. For the sake of simplifying the drawing, connection lines for precharging the internal lines from the signal generator 8 are not shown. The signal generator 8 also delivers the control pulses in response to the row address strobe signal $\overline{RAS}$ and the column address strobe signal $\overline{CAS}$ in a manner which will be described in detail hereinafter utilizing conventional logic and timing circuits for carrying out these functions.

Figure 2:
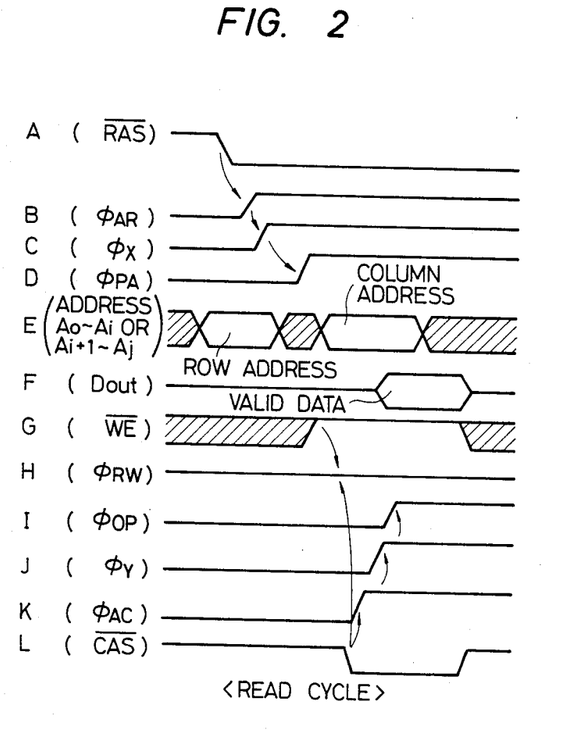
FIGS. 2 and 3 are timing charts for explaining the read and write operations of the embodiment of FIG. 1.
Figure 3:
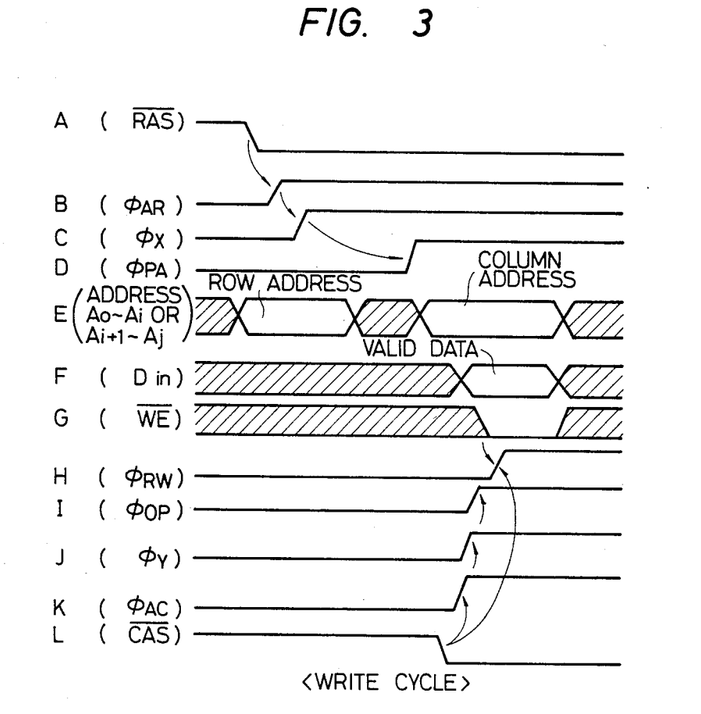

FIGS. 2 and 3 are timing charts showing the operations of the read cycle and write cycle of the D-RAM illustrated in FIG. 1.

Now, the outline of the D-RAM in this embodiment will be described with reference to the block diagram of FIG. 1 and the timing charts of FIGS. 2 and 3.

First, the levels of the respective row address signals $A_O$–$A_i$ are set at such levels as select the row address of a desired memory cell within the memory array 1. Thereafter, the $\overline{RAS}$ signal is made the low level. The signal generator circuit 8 (hereinbelow, termed "SG 8") provides a control signal $\phi_{ARO}$ in response to the fall of the $\overline{RAS}$ signal. When the signal $\phi_{ARO}$ has been provided, the row address buffer (hereinbelow, termed "R-ADB") 2 held in the precharged status in advance is brought into the operating status. As a result, the row address signals $A_O$–$A_i$ are applied to the R-ADB 2 and latched therein. In response to the row address signals $A_O$–$A_i$, the R-ADB 2 generates internal address signals $a_O$, $\overline{a_O}$–$a_i$, $\overline{a_i}$ of true and false levels. Here, the reason why the $\overline{RAS}$ signal is made later than the row address signals $A_O$–$A_i$ is to reliably supply the R-ADB with the row address signals $A_O$–$A_i$ as the row address in the memory array.

Next, the signal $\phi_{AR}$ delayed by a predetermined period of time with respect to the $\overline{RAS}$ signal is applied to the R-ADB. Upon the generation of the signal $\phi_{AR}$, the internal address signals $a_O$, $\overline{a_O}$–$a_i$, $\overline{a_i}$ produced by the R-ADB are transmitted to the row decoder and driver circuit (hereinbelow, termed "R-DCR") 3. The R-DCR 3 decodes the internal address signals $a_O$, $\overline{a_O}$–$a_i$, $\overline{a_i}$. Among the decoded signals of the R-DCR 3, only ones to be selected remain at the high level, and the others not to be selected are brought to the low level.

Subsequently, a signal $\phi_X$ which is delayed by a predetermined period of time with respect to the signal $\phi_{AR}$ is delivered from the SG 8. Upon the generation of the signal $\phi_X$, the decoded signals formed by the R-DCR 3 are transmitted to the row address lines of the memory array (hereinbelow, termed "M-ARY") 1. Here, the reason why the signal $\phi_X$ is delayed with respect to the signal $\phi_{AR}$ is to operate the R-DCR 3 after the operation of the R-ADB 2 has ended. In this way, the row address in the M-ARY 1 is set. That is, one row address line in the M-ARY 1 is selected by one high-level signal among the $2^{i+1}$ output signals of the R-DCR 3.

Next, data signals corresponding to the information of "1" or "0" read out from the respective memory cells, which are connected to the selected single row address line in the M-ARY 1, are amplified by the sense amplifier 7 (hereinbelow, termed "SA 7∞). The amplifying operation of the SA 7 is started upon the generation of the signal $\phi_{PA}$ fed to the sense amplifier 7 from SG 8.

At a proper timing illustrated at E in FIG. 2, the respective levels of the column address signals $A_{i+1}$-$A_j$ are set at such levels as select the column address of the desired memory cell. Thereafter, when the $\overline{CAS}$ signal has been made the low level so as to provide a signal $\phi_{ACO}$ from the SG 8, the column address signals $A_{i+1}$-$A_j$ are applied to the column address buffer (hereinbelow, termed "C-ADB") 4 and latched therein. Here, the reason why the $\overline{CAS}$ signal is made later than the column address signals $A_{i+1}$-$A_j$ is to reliably supply the C-ADB with the column address signals as the column address in the memory array.

Subsequently, a signal $\phi_{AC}$ delayed with respect to the $\overline{CAS}$ signal is delivered from the SG 8, and it is applied to the C-ADB 4. Upon the generation of the signal $\phi_{AC}$, the C-ADB 4 transmits internal address signals $a_{i+1}$, $\overline{a_{i+1}}$-$a_j$, $\overline{a_j}$ corresponding to the column address signals, to the column decoder and driver circuit 5 (hereinbelow, termed "C-DCR 5"). The C-DCR 5 generates $2^{j-1}$ decoded signals by an operation similar to that of the R-DCR 3. Among the decoded signals, one which corresponds to the combination of the internal address signals is brought to the high level. Next, a signal $\phi_Y$ delayed with respect to the signal $\phi_{AC}$ is applied to the C-DCR 5. Upon the generation of the signal $\phi_Y$, the decoded signals are delivered from the C-DCR 5 and transmitted to the multiplexer or column switch (hereinbelow, termed "C-SW") 6. In this way, the column address in the M-ARY 1 is set. That is, one of the bit lines in the M-ARY 1 is selected by the C-SW 6.

One memory address in the M-ARY 1 is set by the above discussed setting of the row address and the column address.

Now, read and write operations for the set address will be explained.

A read mode is specified by the high level of the $\overline{WE}$ signal. The $\overline{WE}$ signal is made the high level before the $\overline{CAS}$ signal is made the low level. Preparations for the read operation are made by bringing the $\overline{WE}$ signal to the high level. Accordingly, when the $\overline{WE}$ signal has been brought to the high level in advance, the read operation gets ready before one address of the M-ARY 1 is set by making the $\overline{CAS}$ signal the low level. As a result, the period of time for starting the read operation can be shortened.

When a signal $\phi_{OP}$ which is a CAS-group signal has been provided from the SG 8, an output amplifier, not shown, which is included in the data output buffer circuit (hereinbelow, termed "DOB") 11 is responsively activated. Information read out from the set address, namely, information supplied through the C-SW 6 is amplified by the activated output amplifier. The amplified information is delivered through the DOB 11 to the data output ($D_{out}$) terminal. Thus, the read operation is carried out. When the $\overline{CAS}$ signal has become the high level, the read operation ends.

A write mode is specified by the low level of the $\overline{WE}$ signal. A signal $\phi_{RW}$ is brought to the high level by the $\overline{WE}$ signal of low level and the $\overline{CAS}$ signal of low level. The signal $\phi_{RW}$ is applied to the data input buffer circuit (hereinbelow, termed "DIB") 10. The DIB is activated by the signal $\phi_{RW}$ of high level, and then transmits write data from the input data ($D_{in}$). terminal to the C-SW 6. The write data is trnasmitted to the set address of the M-ARY 1 through the C-SW 6. As a result, the write operation is performed.

In the write operation, the DOB 11 is inactivated by being supplied with the inverted signal of the signal $\phi_{RW}$, namely, the signal $\phi_{RW}$ of low level. Thus, the data in the write operation is prevented from being read out.

The respective clock signals $\phi_X$, $\phi_Y$ etc. are formed on the basis of the address strobe signals ($\overline{RAS}$ signal, $\overline{CAS}$ signal) in the SG 8 which receives these address strobe signals as stated before. The clock signal $\phi_{RW}$ is formed on the basis of the $\overline{WE}$ signal and the output signal from the SG 8 in the read/write clock generator (R/W-SG) 9.

An important feature of the D-RAM of this embodiment of the present invention is the provision of an automatic refresh circuit 12 (hereinbelow, termed "REF 12") which does not require increasing the number the external terminals of the D-RAM.

The REF 12 forms clock and address signals necessary for the refresh operation, on the basis of the $\overline{RAS}$ signal among the address strobe signals supplied from the external terminals. Also, the REF 12 forms control pulses for inhibiting the precharging operation of the SG 8 during the refresh operation.

Figure 4:
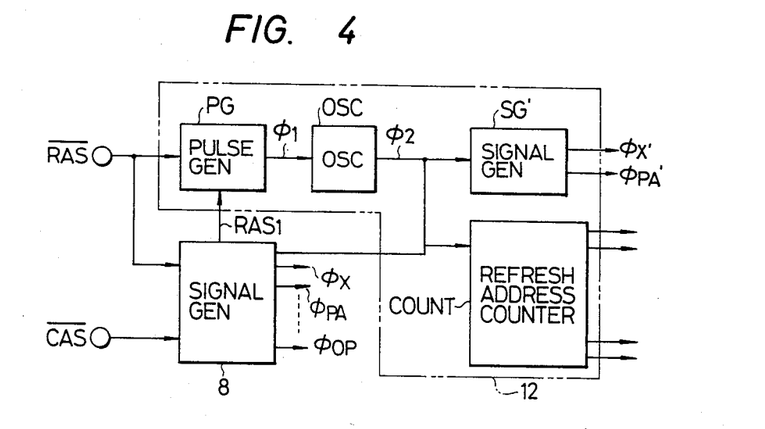
FIG. 4 is a block diagram showing an embodiment of an automatic refresh circuit of FIG. 1 according to this invention.

A concrete block diagram of an embodiment of the REF 12 is shown in FIG. 4. The operations of the REF 12 will now be described with reference to the block diagram shown in FIG. 4.

The $\overline{RAS}$ signal supplied from the external terminal is applied to a pulse generator circuit PG. The pulse generator PG forms a pulse $\phi_1$ which is produced with a delay of the period of time required for precharging the internal circuits of the D-RAM, with respect to the rise timing of the $\overline{RAS}$ signal to the precharged level (the level of the supply voltage $V_{DD}$) and which is brought to its reset level in synchronism with the fall of the $\overline{RAS}$ signal. Although not especially restricted, this embodiment is so constructed that an internal address strobe signal $RAS_1$ (the inverted signal of the $\overline{RAS}$ signal) formed in the SG 8 is supplied to the pulse generator PG in order to reset the pulse $\phi_1$.

The pulse $\phi_1$ is used as an operation start signal for an oscillator circuit OSC. The oscillator OSC forms a pulse $\phi_2$ which sets refresh period. The period of the pulse $\phi_2$ is set so as to have a predetermined ratio of division with respect to the memory access period T which has been or will be described with reference to FIGS. 8, 7 etc. The pulse $\phi_2$ is transmitted to clock signal generators SG' and SG$_8$ and a refresh address counter COUNT.

When the pulse $\phi_2$ has been brought to the high level, the clock generator SG' forms clock signals required for performing the refresh operation, specifically, clocks $\phi_X'$ and $\phi_{PA}'$ corresponding to the respective clock signals $\phi_X$ and $\phi_{PA}$ used in the ordinary operation cycles. The clock signals $\phi_X'$ and $\phi_{PA}'$ are respectively supplied to the R-DCR 3 and the SA 7 shown in FIG. 1.

The number of the pulses $\phi_2$ to be supplied to the counter COUNT corresponds to the number of refresh cycles. The number of the pulses counted by the counter corresponds to a refresh address. Accordingly, the counter COUNT successively increments the refresh address by counting the refresh cycles. The count output signals of the counter COUNT are transmitted to the address input terminals of the R-DCR 3. The counter COUNT is constructed of a counter circuit of the scale of, e.g. $2^{i+1}$.

When the pulse $\phi_2$ has been brought to the high level, the precharging operation of the SG 8 is inhibited by the pulse $\phi_2$ while the refresh operation is carried out.

A multiplexer or the like, not shown, for selecting the address signal delivered from the R-ADB 2 or the address signals delivered from the counter COUNT is disposed on the address input terminal side of the R-DCR 3. The multiplexer for the R-DCR 3 has its operation controlled by the address strobe signal $\overline{RAS}$. Although not especially restricted thereto, the counter COUNT has its address signals transmitted to the R-DCR 3 when the address strobe signal $\overline{RAS}$ is at the high level. On the other hand, the address signals of the R-ADB 2 are transmitted to the R-DCR 3 when the address strobe signal $\overline{RAS}$ is at the low level.

Figure 5:
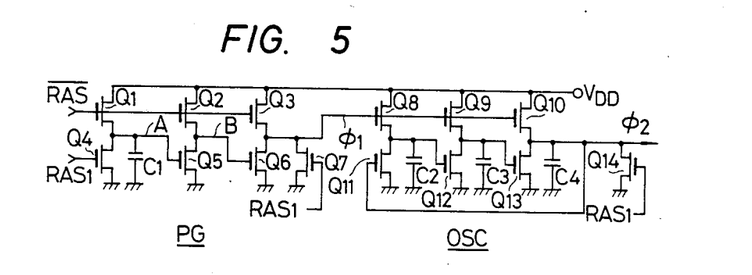
FIGS. 5 and 6 are circuit diagrams each showing a practicable embodiment of the essential portions of the automatic refresh circuit of FIG. 4.

FIG. 5 shows a circuit diagram of a practicable embodiment of the pusle generator PG as well as the oscillator OSC. In the figure, a fundamental circuit arrangement constructed of N-channel MOS transistors is shown in order to simplify the explanation. When the circuit arrangement is to be actually realized as an integrated circuit, various modifications conforming with a principle to be stated hereunder are considered.

The pulse generator PG is constructed of circuit elements to be described below. A MOS transistor $Q_1$ which as the $\overline{RAS}$ signal applied to its gate, and a capacitor $C_1$ constitute an integrator circuit. The output signal A of the integrator circuit is applied to the gate of a driving MOS transistor $Q_5$. A predetermined delay time for the $\overline{RAS}$ signal is set by properly setting the time constant of the integrator circuit and the threshold voltage $V_L$ of the driving MOS transistor $Q_5$. Connected to the drain of the driving MOS transistor $Q_5$ is a load MOS transistor $Q_2$ which is driven by the $\overline{RAS}$ signal. The output signal B of the inverter circuit ($Q_5$, $Q_2$) is applied to an inverter circuit which is composed of a driving MOS transistor $Q_6$ and a load MOS transistor $Q_3$. The output terminal of this inverter circuit ($Q_6$, $Q_3$) delivers the pulse $\phi_1$ which rises with the delay of the period of time required for precharging the internal circuits of the D-RAM, relative to the timing of the rise of the $\overline{RAS}$ signal to the precharged level. In order to synchronize the fall of the pulse $\phi_1$ with the $\overline{RAS}$ signal, there are disposed a resetting MOSFET $Q_4$ which is connected between the capacitor $C_1$ and the ground point of the circuitry and whose gate is supplied with the $RAS_1$ signal, and a resetting MOSFET $Q_7$ which is connected in parallel with the driving MOS transistor $Q_6$ and whose gate has the $RAS_1$ signal applied thereto.

As described before, the $RAS_1$ signal is that inverted signal of the $\overline{RAS}$ signal which has been formed in the SG 8.

The oscillator circuit OSC is constructed of three inverter circuits which are connected in the shape of a ring. The pulse $\phi_1$ is applied to the gates of load MOS transistors $Q_8$–$Q_{10}$ in the respective inverter circuits. Accordingly, the oscillator OSC forms a controlled oscillator circuit which has the start and stop of its oscillating operation controlled by the pulse $\phi_1$. Capacitors $C_2$–$C_4$ for attaining a predetermined oscillation period are coupled to the respective inverter circuits. The oscillator OSC further includes a resetting MOS transistor $Q_{14}$ which has the $RAS_1$ signal applied to its gate, in order to reset the oscillation output pulse $\phi_2$ of the oscillator in synchronism with the $\overline{RAS}$ signal.

Now, the operations of the circuit arrangement shown in FIG. 5 will be described with reference to the timing chart of FIG. 7.

First, the $\overline{RAS}$ signal rises to the high level, whereupon the preceding memory cycle (memory access period) is ended, and the next memory cycle (memory access period) T is started. In response to the rise of the $\overline{RAS}$ signal, the integration output signal A rises as shown at B (signal A) in FIG. 7. When the integration output signal A has reached the logic threshold voltage $V_L$ of the MOS transistor $Q_5$, the pulse $\phi_1$ rises as shown at C (signal $\phi_1$) in FIG. 7. Upon the change of the pulse $\phi_1$ to the high level, the oscillator OSC is activated. As a result, the pulse $\phi_2$ is formed as shown at D (signal $\phi_2$) in FIG. 7, owing to the rise of the pulse $\phi_1$ to the high level.

The rise characteristics and period of the pulses $\phi_2$ are determined by the conductance characteristics of the respective MOS transistors and the capacitances of the capacitors constituting the oscillator OSC. For example, the fast rise of the pulse $\phi_2$ is permitted by raising the charging rate of the capacitor $C_4$. The high level duration of the pulse $\phi_2$ is determined by the discharge rate of the capacitor $C_2$ which is decided by a driving MOS transistor $Q_{11}$, the charging rate of the capacitor $C_3$ which is decided by the load MCS transistor $Q_9$, and the threshold voltages of MOS transistors.

The pulse $\phi_2$ has low level and high level durations $T_1$–$T_6$ which lie within the memory cycle (memory access period) T.

The pulse $\phi_2$ is held at the low level in the time interval $T_1$. Within this time interval $T_1$, namely, within the response delay time of the pulse generator PG and the oscillator OSC, the internal circuits are prehcarged.

The pulse $\phi_2$ is held at the high level in the time interval $T_2$. When the pulse $\phi_2$ has been brought to the high level, the SG 8 does not supply the precharging pulses to the internal circuits which are operated during the refresh operation. Therefore, the precharging operations of the internal circuits are not carried out in the time interval $T_2$. In this time interval $T_2$, the refresh operation is performed. More specifically, the address signals from the counter circuit COUNT shown in FIG. 4 are applied to the R-DCR 3 shown in FIG. 1. The R-DCR 3 receives the aforementioned address signals and the signal $\phi_{X'}$ delivered from the SG' within the REF circuit 12, and thereby selects a group of memory cells determined by the address signals. Information from the selected group of memory cells are applied to the sense amplifier SA shown in FIG. 1. The sense amplifier SA amplifies the information in response to the signal $\phi_{PA'}$ delivered from the SG'. The amplifier information is then written into the group of memory cells again. When the pulse $\phi_2$ falls, the counter circuit COUNT shown in FIG. 3 performs the counting operation in synchronism with the falling edge of the pulse. As a result, the count value of the counter COUNT is updated by +1 (or −1).

The pulse $\phi_2$ is brought to the low level in the time interval $T_3$ again. In response thereto, the circuits of the R-DCR 3, the SA 7, etc. operated in the refresh operation are precharged.

Figure 7:
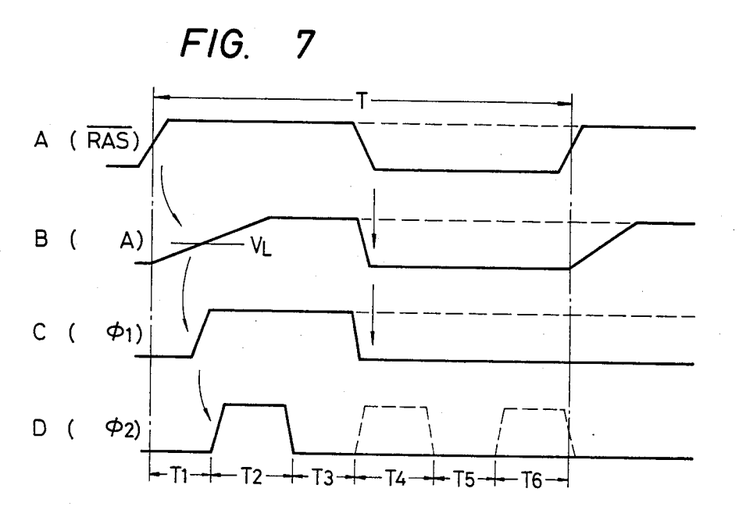
FIG. 7 is a timing chart showing an example of an automatic refresh operation.

In a case where the read or write operation is performed in the memory cycle (memory access period) T, the RAS signal is changed to the low level as indicated by a solid-line curve $\overline{RAS}$ in FIG. 7. By the way, the precharging of the internal circuits started in the time interval $T_3$ must be over when the $\overline{RAS}$ signal changes to the low level. Therefore, the period of the pulses $\phi_2$ is set in conformity with the memory cycle.

When the $\overline{RAS}$ signal is caused to fall, the pulses $\phi_1$ and $\phi_2$ are responsively reset to the low level. In consequence, the signals $\phi_X'$ and $\phi_{PA}'$ are no longer provided from the REF circuit 12. The $\overline{WE}$ signal and the $\overline{CAS}$ signal, which are required for the write or read operation, are changed subsequently to the fall of the $\overline{RAS}$ signal. Upon the changes of these signals, the signals necessary for the write operation or the signals necessary for the read operation are provided from the R/W SG 9 and the SG 8 shown in FIG. 1. At this time, the address multiplexer disposed on the address input terminal side of the R-DCR 3 selects the address signals supplied from the address buffer R-ADB, because the $\overline{RAS}$ signal is at the low level. The memory cell specified by the address signals $A_0$-$A_j$ is selected from within the memory array M-ARY, and information is written into or read out from the memory cell. That is, the write or read operation of information into or from the memory cell, explained with reference to FIG. 2 or 3 before, is carried out.

On the other hand, in a case where the D-RAM is not selected in the memory cycle (memory access period) T, the $\overline{RAS}$ signal is held at the high level as it is, as indicated by a broken line in FIG. 7. In this case, the oscillator circuit OSC continues to oscillate. To this end, the pulse $\phi_2$ is caused to rise to the high level in the time interval $T_4$ again. Accordingly, in a manner similar to the time interval $T_2$, the precharging operations of the internal circuits of, e.g., the R-DCR 3 and the SA 7 are not carried out during time interval $T_4$. Then, the refresh operation for a group of memory cells specified by the row address in the counter COUNT subjected to +1 (or −1) is carried out similarly to the case of the time interval $T_2$.

In the time interval $T_5$ during which the pulse $\phi_2$ is held at the low level again, the precharging operation of the internal circuits of the D-RAM is performed again similarly to the case of the time interval $T_3$. The refresh operation of a group of memory cells having the row address further subjected to +1 (or −1), namely, the updated refresh address, is performed in the time interval $T_6$. Then, the circuit operation shifts to the next memory cycle.

Thenceforth, similar operations are repeated. Accordingly, in the case where the read or write operation is performed in a certain memory cycle (memory access period), only one refresh operation is carried out, and in the case where the read or write is not performed, three refresh operations (of three different row addresses) are carried out.

Figure 6:
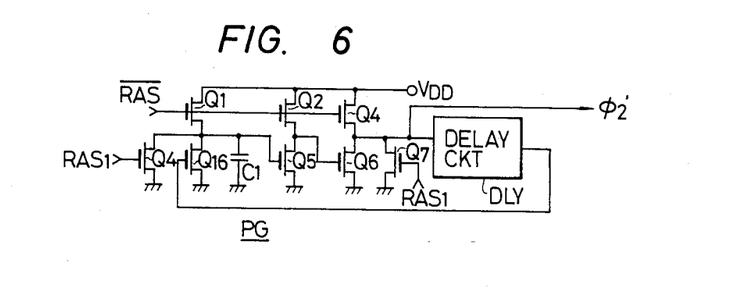

FIG. 6 is a circuit diagram of a modification of the fundamental circuit arrangement shown in FIG. 5.

The circuit arrangement of this embodiment in FIG. 6 is constructed of a pulse generator PG which is similar to the pulse generator PG in FIG. 5, that is, which is composed of MOS transistors $Q_1$-$Q_7$, and a delay circuit DELAY which is coupled to the output side of the pulse generator PG. An output signal delayed by the delay circuit DELAY is fed back to the pulse generator PG. More specifically, the output signal of the delay circuit DELAY is fed back to a driving transistor $Q_{16}$ which is disposed in parallel with a capacitor $C_1$ in the pulse generator PG. Owing to the feedback connection, the pulse generator PG and the delay circuit DELAY construct, in effect, a controlled oscillator circuit. The period of pulses $\phi_2'$ to be delivered from the circuit arrangement shown in FIG. 6 is determined by a lag time which is set by an integrator circuit composed of the load MOS transistor $Q_1$ and the capacitor $C_1$, and a delay time which is set by the delay circuit DELAY.

In case of using the circuit arrangement of FIG. 6, in this manner, the time intervals $T_1$, $T_3$ and $T_5$ are set by means of the integrator circuit, and those $T_2$, $T_4$ and $T_6$ are set by means of the delay circuit.

With the embodiments of the present invention, the automatic refresh operation can be effected without the need for providing any external terminal for the purpose. Therefore, by way of example, a D.RAM of 256 kilobits with the automatic refresh function added thereto can be installed on a package of 16 pins.

In addition, in case of a D.RAM of 64 kilobits, one pin is in surplus after the refresh function has been added to the D.RAM in accordance with the present invention. By utilizing this pin, therefore, another new function can be added.

Further, in these embodiments, the refresh operation is effected in accordance with the pulse $\phi_2$ formed by the internal circuit. Therefore, the time intervals $T_1$, $T_2$ etc. can be set depending upon the operating speeds of the respective internal circuits, and the speed of the memory cycle T can be increased.

The memory cycle (memory access period) depends upon the machine cycle of the central processing unit (CPU) of the computer in which the D.RAM is used. It is accordingly possible to obtain a D.RAM which can satisfactorily cope with enhancing the operating speed of a one-chip CPU such as, for example, a microcomputer. Moreover, since the control signal REF required in the prior art is dispensed with, the memory system control circuit can be simplified, and the D.RAM can be used in substantially the same manner as that of a static RAM.

When it is intended to use the D.RAM of the present invention as the memory of a large-sized computer of high operating speed, the automatic refresh operation described above fails, in effect, to be performed. More specifically, in such a large-sized computer, the memory access period is set to be exceedingly short because of the high operating speed required. Accordingly, the time interval which is allotted to the D.RAM by the CPU for the purpose of precharging the internal circuits of the D.RAM is so short in duration that virtually all of the time is required to actually carry out the precharging. Therefore, within this short precharge time interval, it is difficult to execute the refresh operation according to the automatic refresh of the embodiment.

However, this does not always mean that the D.RAM of the present invention cannot be applied to high-speed uses. On the contrary, the present invention finds application in such highspeed systems as set forth below.

The D.RAM including within the REF circuit a circuit for detecting the pulse width of the $\overline{RAS}$ signal such as shown in FIG. 5 or FIG. 6, that is, the circuit which consists of the integrator circuit composed of the MOSFETs $Q_1$, $Q_4$ and the capacitor $C_1$, and the MOSFET $Q_5$ receiving the output signal of the integrator circuit, can be used as the memory of the large-sized computer of high operating speed by way of example.

In order to permit such uses, the detectable time interval by the detector circuit is set to be slightly longer than the time interval which is really required for precharging the internal circuits of the D.RAM. Concretely, the detection time of the detector circuit is set by the integrator circuit and the MOSFET $Q_5$ receiving the output thereof.

With this measure, if the invention is applied to a microcomputer of low operating speed, etc., the signal $\phi_1$ is delivered from the PG when the $\overline{RAS}$ signal is at the precharged level. As a result, the automatic refresh is carried out. In contrast, if the invention is applied to a large-sized computer of high operating speed, etc., the signal $\phi_1$ is not delivered from the PG. Accordingly, the automatic refresh operation fails to proceed. In this case, the D.RAM adopting the present invention is usable similarly to the conventional D.RAM. That is, in the D.RAM adopting the present invention, the constituent memory cells are refreshed by, e.g., the so-called $\overline{RAS}$ only refresh in the same manner as in the conventional D.RAM.

Therefore, the D.RAM adopting the present invention has very wide applications.

This invention is not restricted to the foregoing embodiments.

By way of example, in FIG. 7, the pulse $\phi_2$ for the refresh operation may be a pulse which is at the low level during the time intervals $T_3$, $T_4$ and $T_5$. Alternatively, it may be a pulse which becomes the high level during only the time interval $T_2$. Such pulses can be formed, for example, in such a way that the change to the high level in the time interval $T_4$ or in the time intervals $T_4$ and $T_6$ is limited by employing the pulse $\phi_2$ of the oscillator circuit OSC and by means of a logic gate circuit, a counter circuit etc. as predetermined.

Further, in FIG. 4, the counter circuit COUNT for the refresh operation may be made a $2^{i+2}$-scale circuit, which provides address signals for the refresh operation in only the first half of one circulation of counting.

In this case, the generation of the pulse $\phi_2$ may be inhibited by the most significant bit signal of the counter circuit. This brings forth the advantage that current consumption attributed to the unnecessary execution of the refresh operation in relation to, e.g., the memory cycle can be reduced.

It is also allowed to dispose a pulse width detector circuit constructed of a timer circuit or the like, so as to switch the refresh periods upon detecting the fact that the memory retention status has been held for a long time. That is, timings may be switched so as to omit the refresh operations of the time intervals $T_4$ and $T_6$ in FIG. 7. Also in this case, power consumption is reduced by avoiding unnecessary executions of the refresh operation.

The system structure of the D.RAM can be modified in various fashions without departing from the scope of the invention.

Figure 9:
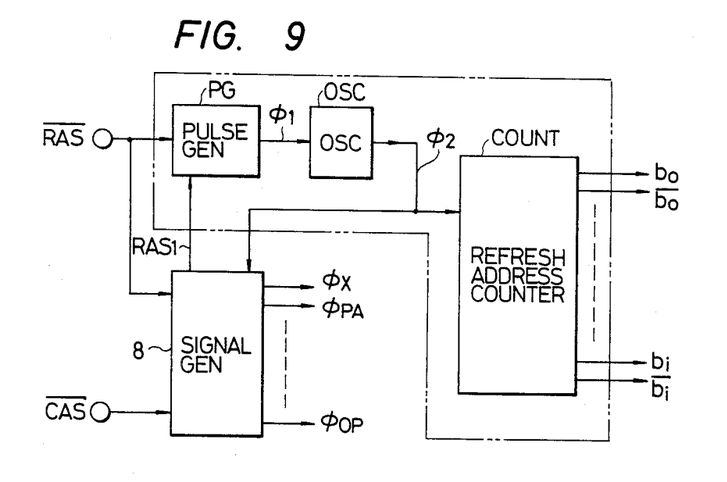
FIG. 9 is a circuit diagram of another embodiment of this invention.

FIG. 9 is a block diagram of the automatic refresh circuit 12 according to another embodiment. Although the automatic refresh circuit 12 of this embodiment corresponds approximately to the embodiment of FIG. 4, it does not have the signal generator SG' used in the embodiment FIG. 4.

In FIG. 9, a pulse generator circuit PG, an oscillator circuit OSC and a counter circuit COUNT are the same as those in FIG. 4. The output signal $\phi_2$ of the oscillator OSC is supplied to the signal generator 8.

Unlike the arrangement used the embodiment in FIG. 4, the signal generator 8 has its internal circuits constructed to regard the output signal $\phi_2$ of the oscillator OSC as a pseudo row address strobe signal. In addition, the operation of the data output buffer DOB shown in FIG. 1 is not required during the refresh operation. Accordingly, the signal generator 8 has a suitable inhibitor circuit in order to inhibit the delivery of the signal $\phi_{OP}$ even when it is supplied with the pseudo strobe signal.

The operations of the circuit arrangement in FIG. 9 resemble those of the circuit arrangement in FIG. 4.

When the row address strobe signal $\overline{RAS}$ supplied to the external terminal of the circuit arrangement has been brought from the low level to the high level, the signal generator 8 generates precharging pulses for putting the internal circuits, shown in FIG. 1, into the precharged statuses. The signal $RAS_1$, which is brought to the low level in response to the change of the row address strobe signal $\overline{RAS}$ to the high level, is provided from the signal generator 8. In response to them, the pulse generator PG delivers the signal $\phi_1$ similar to the signal $\phi_1$ in FIG. 4. The oscillator OSC delivers the refresh pulse $\phi_2$ of high level in response to the output signal $\phi_1$ of the pulse generator PG.

In response to the refresh pulse $\phi_2$, the signal generator 8 delivers the control pulses $\phi_X$, $\phi_{PA}$ etc. In this case, the control pulse $\phi_{OP}$ is not delivered as described above. The refresh operation is executed by the control pulses $\phi_X$, $\phi_{PA}$ etc.

After a predetermined time interval which is decided by the oscillator OSC, the refresh pulse $\phi_2$ is brought to the low level again. In response to this change of the refresh pulse $\phi_2$ from the high level to the low level, the signal generator 8 produces the precharging pulses for putting the internal circuits, shown in FIG. 1, into the precharged statuses.

If, in spite of the lapse of a predetermined time interval since the start of the precharging operation, the D.RAM is not accessed, that is, the external row address strobe signal $\overline{RAM}$ is not made the low level, the refresh pulse $\phi_2$ of high level is delivered from the oscillator OSC again. In response thereto, the refresh operation is restarted.

In a case where the external row address strobe signal $\overline{RAS}$ has been changed from the high level to the low level, proper control pulses are responsively provided from the signal generator 8 as in the embodiment of FIG. 4.

In order to cause the pulse generator PG to respond to only the external row address strobe signal, the signal $RAS_1$ to be provided from the signal generator 8 is made responsive to the external row address strobe signal, but not to the refresh pulse $\phi_2$.

The circuit arrangement of the embodiment in FIG. 9 does not need the signal generator SG' as shown in FIG. 4. This makes it possible to reduce the number of circuit elements.

I claim:

1. A dynamic random access memory which includes memory cells that need to be periodically refreshed, internal circuits that are brought into precharged statuses and thereafter into operating statuses, and means for accessing said memory cells in response to an address strobe signal that is supplied said dynamic random access memory, said dynamic random access memory comprising:
- a pulse generator which generates refresh pulses upon detecting inhibition of the supply of the address strobe signal to said dynamic random access memory; and
- an address counter which forms refresh address data by counting the refresh pulses,
- wherein a refresh timing of the memory cells specified by said address counter is determined by the refresh pulses in accordance with the inhibition of said address strobe signal to said dynamic random access memory.

2. A dynamic random access memory according to claim 1, further comprising:
- a timing pulse generator which generates precharging pulses for bringing said internal circuits into the precharged statuses when the supply of the address strobe signal to said dynamic random access memory is inhibited, and which generates control pulses for bringing said internal circuits into the operating statuses when the address strobe signal is supplied to said dynamic random access memory.

3. A dynamic random access memory according to claim 2, wherein said pulse generator is comprised of a first circuit which detects the inhibition of the supply of the address strobe signal to said dynamic random access memory and which produces a detection output signal upon detection of the inhibition of the supply of the address strobe signal, and a second circuit which is started by a detection output signal of said first circuit and which generates a refresh pulse in response to the receipt of said detection output signal by said second circuit.

4. A dynamic random access memory according to claim 3, wherein said second circuit is comprised of a controlled oscillator circuit, and further comprising means for controlling start and stop times of said controlled oscillator circuit in accordance with the detection output signal of said first circuit so that the refresh pulses are periodically generated in a time interval during which the address strobe signal is not supplied to said dynamic random access memory.

5. A dynamic random access memory according to claim 4, wherein said first circuit includes a delay circuit which is comprised of an integrator circuit, wherein a delay time for said delay circuit is set so that the refresh pulses are generated after the end of a precharging operation of said internal circuits which precharging operation is started when the supply of the address strobe signal to said dynamic random access memory has been inhibited.

6. A dynamic random access memory according to claim 5, including means for setting a time interval between one refresh pulse to be delivered from said controlled oscillator circuit and another refresh pulse to be subsequently delivered to be longer than a time interval which is required for precharging said internal circuits.

7. A dynamic random access memory according to claim 2, wherein said pulse generator includes a delay circuit which is comprised of an integrator circuit, wherein a delay time for said delay circuit is set so that the refresh pulses are generated after the end of a precharge operation of said internal circuits which precharge operation is started when the supply of the address strobe signal to said dynamic random access memory is inhibited.

8. A dynamic random access memory according to claim 2, wherein said pulse generator is comprised of a controlled oscillator circuit whose operation is controlled by the address strobe signal.

9. A dynamic random access memory according to claim 2, wherein said address strobe signal is applied to said dynamic random access memory through an external terminal of said dynamic random access memory.

10. A dynamic random access memory comprising: a memory cell array including a plurality of memory cells;
- internal circuits coupled to said memory cell array for performing reading and writing operations with regard to said memory cell array in accordance with externally applied control signals;
- memory access means coupled to said memory cell array including means for selecting individual memory cells in said memory array for said reading and writing operations in response to externally applied address signals upon the application of an address strobe signal to said dynamic random access memory;
- precharging means coupled to said internal circuits and coupled to receive said address strobe signal, said precharging means including means for supplying precharging signals to said internal circuits when an address strobe signal is not being applied to said dynamic random access memory; and
- refresh means coupled to receive said address strobe signal, said refresh means including means for inhibiting said precharging means for a predetermined period of time when said address strobe signal is not being applied to said dynamic random access memory and means for providing refresh signals to said memory cells during said predetermined period of time.

11. A dynamic random access memory according to claim 10, wherein said refresh means comprises:
- means for determining a first point of time when an address strobe signal has stopped being applied to said dynamic random access memory, at which said first point of time said precharging means is activated to provide said precharging signals to said internal circuits;
- means for producing an inhibit signal at a predetermined second point of time subsequent to said first point of time for inhibiting said precharging means from providing said precharging signals to said internal circuits;
- means for producing said refresh signals for a predetermined period of time $T_R$ following said second point of time, during which said predetermined time $T_R$ said precharging means remains inhibited; and
- means for reactivating said precharging means at a third point of time after said predetermined period of time $T_R$ to again provide said precharging signals to said internal circuits while said address strobe signal is not being applied to said dynamic random access memory.

12. A dynamic random access memory according to claim 11, wherein said means for producing an inhibit signal comprises a pulse generator including an integrator for providing a predetermined delay time following the first point of time during which said predetermined delay time said precharging means is activated, and an oscillator for producing a timing pulse having a time period corresponding to $T_R$ to inhibit said precharging means while simultaneously generating said refresh signals.

13. A dynamic random access memory according to claim 11, wherein said oscillator produces a plurality of said timing pulses having said time period $T_R$ and spaced apart from one another by a predetermined period of time to intermittently inhibit said precharging means and simultaneously provide said refresh signals to said memory cells following said third point of time until such time as said address strobe signal is again applied to said dynamic random acces memory.

14. A dynamic random access memory formed as an integrated circuit on a single semiconductor substrate which includes memory cells that need to be periodically refreshed, internal circuits that are brought into precharged statuses and thereafter into operating statuses, and means for accessing said memory cells in response to an address strobe signal that is supplied to said dynamic random access memory, said dynamic random access memory having a refreshing means for providing refresh pulses to said memory cells without the need for an external terminal being provided for supplying said refresh pulses, said refreshing means comprising:
a pulse generator which generates said refresh pulses internally within said integrated circuit upon detecting inhibition of the supply of the address strobe signal to said dynamic random access memory; and
an address counter which forms refresh address data by counting the refresh pulses,
wherein a refresh timing of the memory cells specified by said address counter is determined by the refresh pulses in accordance with the inhibition of said address strobe signal to said dynamic random access memory.

15. A dynamic random access memory according to claim 14, further comprising:
a timing pulse generator which generates precharging pulses for bringing said internal circuits into the precharged statuses when the supply of the address strobe signal to said dynamic random access memory is inhibited, and which generates control pulses for bringing said internal circuits into the operating statuses when the address strobe signal is supplied to said dynamic random access memory.

16. A dynamic random access memory according to claim 15, wherein said address strobe signal is applied to said dynamic random access memory through an external terminal of said dynamic random access memory.

17. A dynamic random access memory formed as an integrated circuit on a single semiconductor substrate comprising:
a memory cell array including a plurality of memory cells;
internal circuits coupled to said memory cell array for performing reading and writing operations with regard to said memory cell array in accordance with externally applied control signals;
memory access means coupled to said memory cell array including means for selecting individual memory cells in said memory array for said reading and writing operations in response to externally applied address signals upon the application of an address strobe signal to said dynamic random access memory;
precharging means coupled to said internal circuits and coupled to receive said address strobe signal, and precharging means including means for supplying precharging signals to said internal circuits when an address strobe signal is not being applied to said dynamic random access memory; and
refresh means coupled to receive said address strobe signal, said refresh means including means for inhibiting said precharging means for a predetermined period of time when said address strobe signal is not being applied to said dynamic random access memory and means for generating refresh signals to be provided to said memory cells during said predetermined period of time, said refresh signals being generated internally within said integrated circuit without the need for an external terminal being provided to supply refresh signals.

18. A dynamic random access memory according to claim 17, wherein said refresh means comprises:
means for determining a first point of time when an address strobe signal has stopped being applied to said dynamic random access memory, at which said first point of time said precharging means is activated to provide said precharging signals to said internal circuits;
means for producing an inhibit signal at a predetermined second point of time subsequent to said first point of time for inhibiting said precharging means from providing said precharging signals to said internal circuits;
means for producing said refresh signals for a predetermined period of time $T_R$ following said second point of time, during which said predetermined time $T_R$ said precharging means remains inhibited; and
means for reactivating said precharging means at a third point of time after said predetermined period of time $T_R$ to again provide said precharging signals to said internal circuits while said address strobe signal is not being applied to said dynamic random access memory.

19. A dynamic random access memory according to claim 18, wherein said means for producing an inhibit signal comprises a pulse generator including an integrator for providing a predetermined delay time following the first point of time during which said predetermined delay time said precharging means is activated, and an oscillator for producing a timing pulse having a time period corresponding to $T_R$ to inhibit said precharging means while simultaneously generating said refresh signals.

20. A dynamic random access memory according to claim 18, wherein said oscillator produces a plurality of said timing pulses having said time period $T_R$ and spaced apart from one another by a predetermined period of time to intermittently inhibit said precharging means and simultaneously provide said refresh signals to said memory cells following said third point of time until such time as said address strobe signal is again applied to said dynamic random access memory.

* * * * *